United States Patent [19]

Gupta et al.

[11] Patent Number: 5,198,963
[45] Date of Patent: Mar. 30, 1993

[54] MULTIPLE INTEGRATED CIRCUIT MODULE WHICH SIMPLIFIES HANDLING AND TESTING

[75] Inventors: Debabrata Gupta, Scottsdale; James E. Drye, Mesa, both of Ariz.

[73] Assignee: Motorola, Inc., Schaumburg, Ill.

[21] Appl. No.: 795,440

[22] Filed: Nov. 21, 1991

[51] Int. Cl.[5] ............................................. H05K 7/20
[52] U.S. Cl. ................................... 361/386; 361/387; 361/388; 361/400; 361/396; 257/737; 257/777
[58] Field of Search ............... 174/252, 254, 255, 261; 357/74, 75, 80; 361/386–389, 393, 396, 398, 400, 401, 408

[56] References Cited

U.S. PATENT DOCUMENTS

| | | | |
|---|---|---|---|
| 3,436,604 | 4/1969 | Hyltin et al. | 174/252 |
| 4,744,008 | 5/1988 | Black et al. | 361/386 |
| 5,049,978 | 9/1991 | Bates et al. | 357/80 |

OTHER PUBLICATIONS

Larnerd "IC Pakage Assembly", IBM Tech. Disclosure Bulletin, vol. 20, No. 12, May 1978 pp. 5142–5143.

Primary Examiner—Gregory D. Thompson
Attorney, Agent, or Firm—Joe E. Barbee

[57] ABSTRACT

A multi-chip module (26) used to interconnect and house a plurality of integrated circuits (10). The module (26) employs an intermediate structure referred to, herein, as a bridge chip (12). The bridge chip (12) connects the integrated circuit (10) to the module substrate (19). The integrated circuit (10) is attached to the bridge chip (12) and forms a composite structure (18) which can be burned-in and tested as an individual unit. The bridge chip (12) has interconnects to bring out the inputs and outputs of the integrated circuit (10). The composite structure (18) is mounted to the module substrate (19) such that, the integrated circuit (10) has a thermal pathway to the module substrate (19), and the bridge chip (12) connects to the module substrate (19). The module substrate (19) has interconnects to connect the plurality of composite structures (18).

15 Claims, 2 Drawing Sheets

MULTIPLE INTEGRATED CIRCUIT MODULE WHICH SIMPLIFIES HANDLING AND TESTING

BACKGROUND OF THE INVENTION

This invention relates, in general, to integrated circuit packages, and more particularly, to packages containing multiple integrated circuits connected together on a shared substrate, commonly referred to as a multi-chip module.

The size, complexity, and speed of integrated circuits are increasing every year. The technology to interconnect and package integrated circuits is critical to generate benefit from the integrated circuit process and design advances. Some of the problems package designers must contend with are high input and output pin counts, power dissipation, noise, power and ground strategies, Input/Output loading (resistive, capacitive, and inductive effects), CAD requirements, burn-in/test, and package costs.

In package design, density can translate directly to speed. The trend is to develop methods to house and interconnect multiple integrated circuits in the smallest area possible. It can be a very difficult task to balance the different aspects of package design for a multi-chip carrier. This type of packaging is referred to as a multi-chip module.

It is now recognized that for cost-effective production of such multi-chip modules it is critical to burn-in and test individual components which comprise the multi-chip module prior to the multi-chip module fabrication. Full functional testing is performed after the burn-in process. Though such modules have been built by the vertically integrated system manufacturers for some time, there are still very few low cost solutions. It is also necessary to provide reliable means of replacing defective components after functional test of the module.

One style of multi-chip module uses solder bumping techniques to attach integrated circuits to a module substrate. Solder bumps are placed on the pads of the integrated circuit or module (or both). The integrated circuit is then mated to the module substrate. A thermal cycle melts the solder and bonds the pad areas together. The module substrate has interconnects to route the integrated circuit's I/O (Inputs and Outputs) to the system netlist.

The solder bump technique has advantages over other multi-chip module methods. Pad areas are not confined to the periphery of the integrated circuit. The number of pads may be increased by adding pads to the internal sections of the die. Integrated circuits can be placed in close proximity to each other on the substrate minimizing chip to chip delay. Moreover, the inductance of the solder bumps are almost an order of magnitude smaller than other standard interconnection methods (for example wire-bonding or TAB) increasing system performance. Exotic materials are not used in the process. Solder bumping has proven a manufacturable process that is cost effective and reliable for multi-chip modules.

The conventional solder bump approach does not address all package requirements. Test is an extremely important issue for multi-chip modules. How the testing is approached can have a direct impact on project development time, test complexity, tester time, test quality, and module cost. It is imperative to keep multi-chip module final test failures to an absolute minimum. Module cost may be expensive enough to justify rework on any system with defective parts. The conventional test method employed consists of parametric and functional testing of the unpackaged integrated circuits at wafer probe, the good parts are sorted out, then attached to the module substrate, life cycle tests are run on the module, and a final test to prove system integrity. Burn-in of the unpackaged integrated circuit is difficult to implement and is often not carried out. The flaw with this approach is the likelihood of an integrated circuit failing after the multi-chip module has been built. Also, the final test of the module to insure that the system functions correctly can be extremely complex and time consuming. This increases both development time and cost.

Another aspect of multi-chip modules incorporating densely packed high power integrated circuits is that efficient heat dissipation is required. The amount of power dissipated by the system is dependent on the process technology and the type of circuitry used. As integrated circuits are placed closer together the power dissipation problem becomes aggravated. In the conventional solder bump interconnection technology the only contact the integrated circuits have to the module substrate is through the solder bumps but heat dissipation through the solder bumps is not an ideal solution. Thermal bumps for increased heat dissipation can be added to the integrated circuits at the cost of active area. The heat generated by the integrated circuits is more efficiently dissipated into the ambient by way of the back plane of the integrated circuit. For multi-chip modules that need better thermal dissipation capabilities, complex attachments such as thermal conduction modules incorporating heat sinking or forced air is used. This increases the complexity of the module and adds to the cost.

Solder bumping is performed at a wafer level. The steps must be controlled to insure the proper size and uniformity of the solder bumps. The technology to bump individual die is not readily available at this time. If a semiconductor manufacturer wants to supply integrated circuits for a multi-chip module, facilities must be set up for in-house solder bumping or arrangements for third-party bumping would be needed. Since the size and uniformity of the solder bumps are critical to the module assembly process, it would be desirable if this was under the control of a single group in the module manufacturing process. Also, having the ability to handle individual integrated circuit die would allow many suppliers to compete as a source of components.

Most of these issues can be tied into increased manufacturing costs and extended multi-chip module development time. Accordingly, it would be desirable to provide a multi-chip module which overcomes the deficiencies of the prior art.

SUMMARY OF THE INVENTION

Briefly stated, the present invention is achieved by creating a new structure which acts as an interface between integrated circuits and a module substrate, this new structure is referred to, herein, as a bridge chip. The integrated circuit is attached to the bridge chip. The inputs and outputs of the integrated circuit are brought out through interconnects on the bridge chip. The bridge chip and integrated circuit form a composite structure which allows burn-in and test of an individual unit prior to module assembly. A plurality of such composite structures are attached to the module substrate. The interconnect interface between each composite structure and the module substrate is on the bridge chip portion of the composite structure. The composite structure and module substrate are designed to fit together so the back face of the integrated circuit contacts the module substrate through a conductive die attach. Thus, there is a greatly improved path of heat transfer from the integrated circuit to the substrate. Interconnects on the module substrate connects the composite structures together.

DETAILED DESCRIPTION OF THE DRAWINGS

Figure 1:
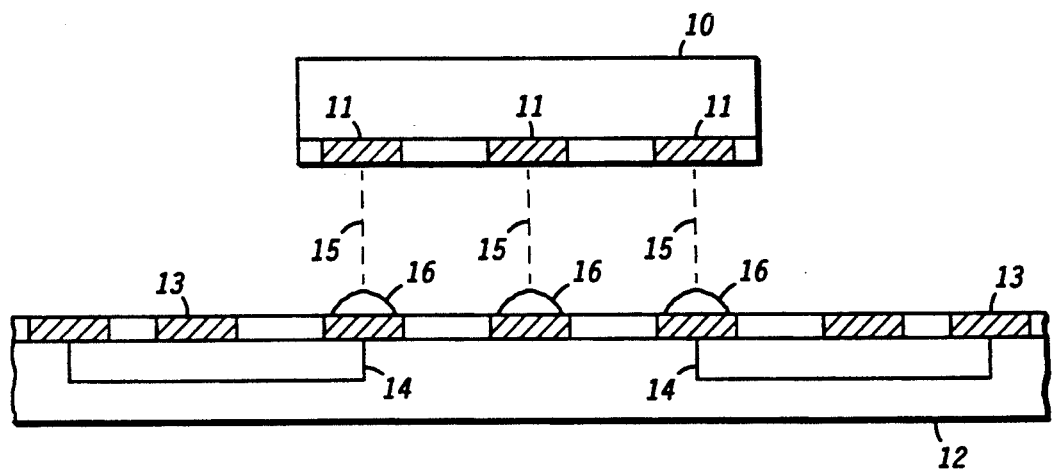
FIG. 1 is a cross-sectional view of a portion of an embodiment of the present invention.

FIG. 1 is an illustration of an exploded cross-sectional view of an integrated circuit 10 and a bridge chip. Integrated circuit 10 has specific areas to be interconnected which shall be referred to, herein, as the integrated circuit specific contact points 11. The integrated circuit specific contact points 11 are metal pads.

Bridge chip 12 has contact points 13, some of which, align to integrated circuit specific contact points 11. Bridge chip contact points 13 are metal pads. Bridge chip 12 can be made of various materials like silicon, glass, or an organic material. Solder bumps 16 are placed on bridge chip contact points 13 which align to integrated circuit specific contact points 11. Bridge chip 12 has means 14 for interconnecting bridge chip contact points 13. Interconnect means 14 on the bridge chip 12 can be created by thin-film techniques when silicon or glass are used. The solder bump technique is illustrated as interconnecting integrated circuit 10 to bridge chip 12; however, any suitable technique can be used, such as optical, magnetic or a combination thereof.

Figure 2:
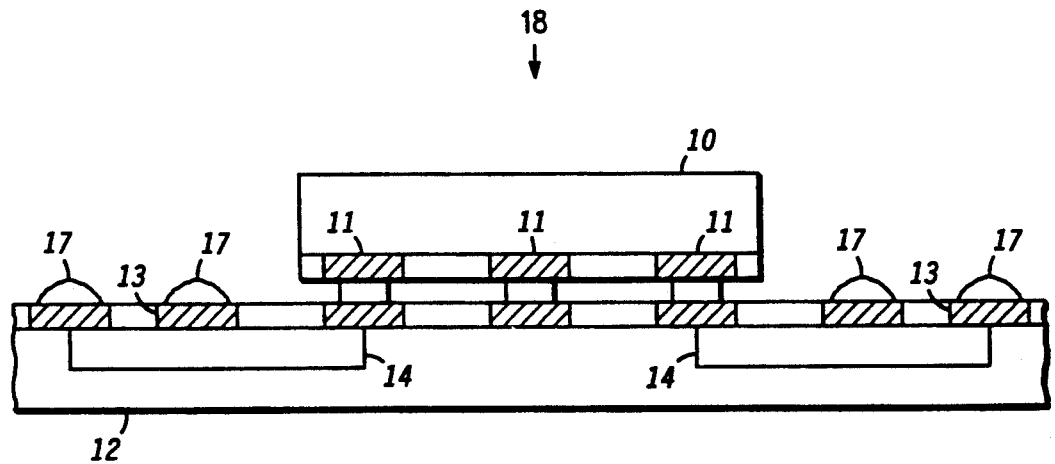
FIG. 2 is a cross-sectional view of the embodiment of FIG. 1 further along in the assembly process forming a a composite structure.

Integrated circuit specific contact points 11 are aligned with bridge chip contact points 13 as indicated by a plurality of dotted lines 15. Integrated circuit 10 is aligned and tacked to bridging chip 12 so integrated circuit specific contact points 11 contact the solder bumps 16. The first of two thermal cycles is run on integrated circuit 10 and bridge chip 12. The thermal cycle melts solder bumps 16 and connects integrated circuit specific contact points 11 to bridge chip contact points 13 to form a composite structure 18, which is illustrated in FIG. 2. The solder performs a second function other than electrical interconnect. The solder forms a mechanical bond holding integrated circuit 10 to bridge chip 12.

For cases when integrated circuit 10 dissipates a significant amount of power, the preferred method is to build bridge chip 12 of material similar to integrated circuit 10, thereby reducing stress at the solder bond interface due to similar temperature coefficients of expansion. For cases where thermal and electrical requirements allow, the bridge chip 12 can be made of material dissimilar to the integrated circuit 10 such as organic material amenable to high density circuitry.

Composite structure 18 can be handled and tested as an individual unit. Previous methods for building modules attached the individual die directly to the module substrate. Tests were performed at wafer probe or on the entire module. Bridge chip 12 creates an intermediate step in the module manufacture process where the composite structure 18 can be burned in and tested similar to a packaged part.

Integrated circuit specific contact points 11 are brought out on bridge chip 12 through interconnect 14 to bridge chip contact points 13 wherein interconnect means 14 comprise metal interconnect lines. Composite structure 18 can be handled as an individual unit. Testing can be performed through contact points 13 on the bridge chip 12 portion of composite structure 18. Following burn-in at elevated temperatures the composite structure 18 is exhaustively tested (parametric, functional, speed, life cycle, stress, etc.). By performing the complex and time consuming testing on the individual composite structures 18, test requirements can be reduced in the later stages of the design. Increased testing at this stage will reduce the chance of a failure later on in the module manufacture thereby reducing the need for rework after a plurality of composite structures 18 are assembled together.

Composite structures 18 having been tested and confirmed good, are prepared for the final stage of bonding. Solder bumps 17 are deposited on contact points 13 of the bridge chip portion of composite structure 18 as shown in FIG. 2.

In the preferred embodiment, solder bumping need only be performed on the bridge chip 12. By restricting the solder bumping to bridge chip 12, tighter specifications can be met because only bridge chips are handled in the solder bump process, simplifying manufacturing, increasing yield, and reliability of the process. For this module manufacturing process integrated circuit vendors and multi-chip module manufacturers need not own solder bump equipment. Integrated circuit vendors would supply individual integrated circuit die to the bridge chip 12 manufacturer to form composite structures 18 Multi-chip module manufacturers would purchase burned-in and tested composite structures 18 to build systems. This would increase the number of potential suppliers, reduce cost through competition, and simplify the process for module manufacture.

Figure 3:
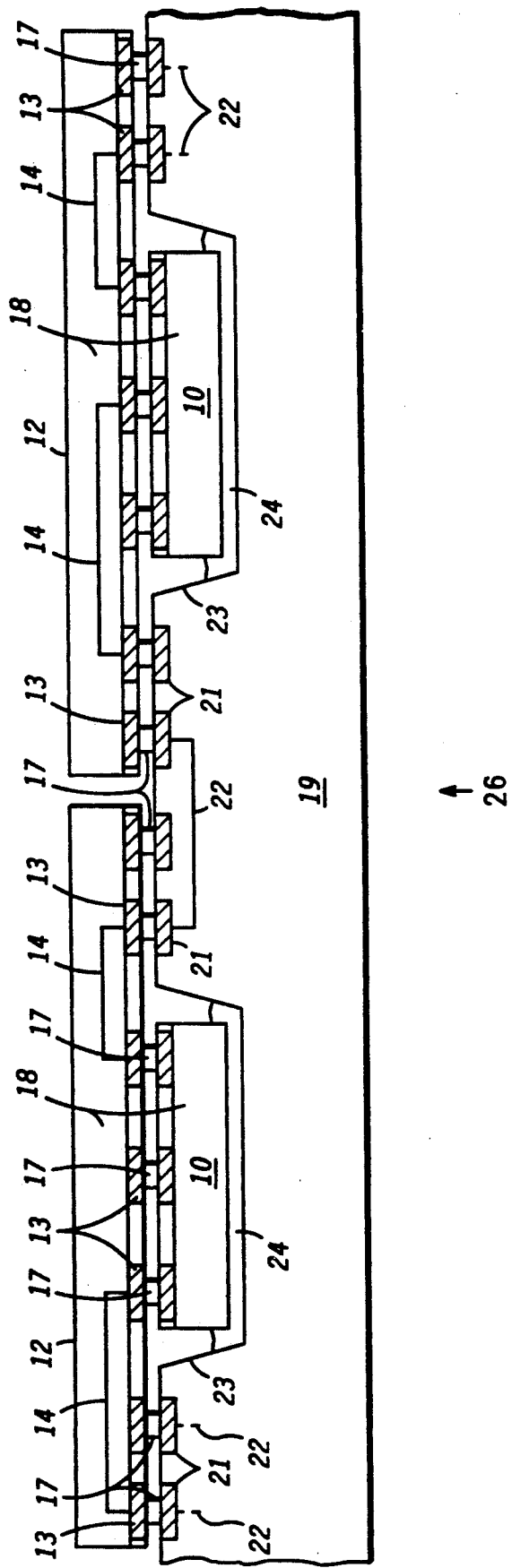
FIG. 3 is a cross-sectional view of the present invention incorporating the FIG. 2 composite structure.

The module substrate 19 is illustrated in FIG. 3. The multi-chip module in this disclosure can use a variety of module substrates 19 that span a range of performance and cost. Some examples of a module substrate material are monolithic silicon with etched cavities, a composite of silicon and thermally conductive ceramic (aluminum nitride for example), monolithic aluminum nitride with molded/machined cavities, a composite of aluminum and aluminum nitride with machined cavity, and a multilayer fine-pitch organic board with conductive metal inserts for thermal vias. Interconnect on the substrates for the first four examples could be built with multiple layers of conductive materials (Al,Cu), etched to form interconnect patterns and isolated from each other by dielectric layers such as polyimide. Each type of module substrate material may have a specific benefit for a multi-chip module application, all are directly applicable to the described invention.

FIG. 3 illustrates a plurality of composite structures 18 which are interconnected on a module substrate 19. Contact points 13 on bridge chip 12 align with contact points 21 of module substrate 19. Module substrate 19 has etched cavities 23 to accommodate integrated circuit 10 of composite structure 18. A conductive die attach material 24 is placed in the bottom of the cavities 23. Contact points 13 on bridge chip 12 are aligned with module substrate contact points 21 and merged until solder bumps 17 touch module substrate contact points 21. Conductive die attach material 24 conforms to height variations due to varying cavity depths, integrated circuit thickness, and solder bump size. Conductive die attach material 24 bonds integrated circuit 10 of composite structure 18 to module substrate 19. Conductive die attach material 24 also forms a thermal pathway from integrated circuit 10 to module substrate 19. The conductive die attach material 24 can be composed of an organic/inorganic material appropriate for the module application. Module substrate 19 acts as a heat sink. A second thermal cycle is run which melts solder bumps 17 and connects composite structure contact points 13 to module substrate contact points 21. Solder bump material 17 used in the second thermal cycle shall have a lower melting point than the solder material in the first thermal cycle. As the second thermal cycle is completed at a lower temperature than the melting point of the solder material used in the first thermal cycle, the solder bonds formed in the first thermal cycle will be unaffected by the second thermal cycle. Module substrate 19 has interconnects 22 for interconnecting module substrate contact points 21 wherein interconnects 22 comprise metal lines.

Multi-chip module 26 can be tested through contact points on module substrate 19. By exhaustively testing the individual composite structures 18, testing of multi-chip module 26 need not be as comprehensive. The test can be limited to checking the interconnection of the composite structures 18 and a minimized functional test of multi-chip module 26. Prior methods required extensive testing of the multi-chip module due to limited burn-in/test capability on the individual integrated circuits. Low first pass yields on the assembled multi-chip modules adds cost, increases testing, and forces manufacturers to consider repair on the non-functional multi-chip modules.

A multi-chip module which addresses many of the limitations of current module approaches has been described. The novel design employs bridge chip 12 which connects integrated circuit 10 to module substrate 19. Integrated circuit 10 is attached to the bridge chip 12 which can be handled and tested as an individual unit prior to mounting on module substrate 19. A plurality of composite structures 18 of integrated circuit 10 and bridge chip 12 are placed on module substrate 19 in such a way that each integrated circuit 10 has a thermal pathway to the module substrate 19. Using this multi-chip module approach, individual die can be handled, comprehensive testing can be performed on the die, solder bumping can be localized to the bridge chip, the substrate is used as a heat sink, and final module testing can be reduced.

We claim:

1. A multiple integrated circuit module which simplifies handling and testing comprising:
a plurality of integrated circuits, each integrated circuit having specific contact points;
a plurality of bridge chips, each bridge chip having a corresponding integrated circuit from the plurality of integrated circuits wherein each bridge chip has a plurality of contact points, some of which correspond to the specific contact points of the corresponding integrated circuit;
a first means for interconnecting predetermined ones of the contact points on each bridge chip;
a second means for interconnecting the specific contact points of a corresponding integrated circuit to the contact points corresponding to specific contact points of the bridge chip comprising a plurality of solder bumps of a first thermal melting temperature;
a module substrate for receiving each combination of an integrated circuit interconnected to a corresponding bridge chip, the module substrate having a plurality of contact points corresponding to remaining contact points on each bridge chip;
a third means for interconnecting the contact points on the module substrate; and
a fourth means for interconnecting the contact points of the module substrate to remaining contact points on each bridge chip comprising solder bumps of a second thermal melting temperature.

2. The multiple integrated circuit module which simplifies handling and testing of claim 1, wherein the contact points are metal pads.

3. The multiple integrated circuit module which simplifies handling and testing of claim 1, wherein the second means for interconnecting comprising a plurality of solder bumps when heated to the thermal melting temperature forms a plurality of mechanical bonds thereby holding each bridge chip to a corresponding integrated circuit.

4. The multiple integrated circuit module which simplifies handling and testing of claim 1, wherein specific contact points of an integrated circuit and some contact points of a corresponding bridge chip which correspond to the specific contact points of the integrated circuit align vertically to simplify mechanical connection.

5. The multiple integrated circuit module which simplifies handling and testing of claim 3, wherein the module substrate, the plurality of bridge chips, and the plurality of integrated circuits have similar thermal expansion coefficients to minimize stress.

6. The multiple integrated circuit module which simplifies handling and testing of claim 1, wherein the module substrate has a plurality of cavities, each cavity accommodates an integrated circuit.

7. The multiple integrated circuit module which simplifies handling and testing of claim 1, wherein the fourth means for interconnecting comprising solder bumps has a lower thermal melting temperature than the second means for interconnecting.

8. The multiple integrated circuit module which simplifies handling and testing of claim 1, further including:
a means for coupling the plurality of integrated circuits to the module substrate wherein the means for coupling is a conductive die attach material that forms a mechanical bond between each integrated circuit and the module substrate thereby fastening each integrated circuit to the module substrate, the conductive die attach material also serves as a thermal pathway from each integrated circuit to the module substrate.

9. The multiple integrated circuit module which simplifies handling and testing of claim 1, wherein two distinct thermal cycles are used to form a multiple integrated circuit module, a first thermal cycle for forming the second means of interconnecting which couples each of the plurality of integrated circuits to a corresponding bridge chip and a second thermal cycle for forming the fourth means for interconnecting which couples remaining contact points on each bridge chip to corresponding contact points on the module substrate and wherein the second thermal cycle does not affect solder bonds formed in the first thermal cycle.

10. The multiple integrated circuit module which simplifies handling and testing of claim 1, wherein remaining contact pads on each bridge chip align vertically to corresponding contact pads on the module substrate to simplify mechanical connection.

11. A multiple integrated circuit module comprising:
a module substrate wherein the module substrate has a plurality of contact points for coupling externally;
a plurality of integrated circuits each integrated circuit has a plurality of specific contact points for coupling externally;
a plurality of bridge chips, each bridge chip having a plurality of contact points some of which correspond to the specific contact points of a corresponding integrated circuit;
a first means for interconnecting each of the plurality of integrated circuits to a corresponding bridge chip of the plurality of bridge chips wherein the first means for interconnecting comprises a plurality of solder bumps, wherein each solder bump connects a specific contact point of an integrated circuit to a corresponding contact pad of a corresponding bridge chip, and wherein the plurality of solder bumps has a just thermal melting temperature; and
a second means for interconnecting remaining contact points on each of the plurality of bridge chips to corresponding contact points on the module substrate wherein the second means for interconnecting comprises a plurality of solder bumps, wherein each solder bump connects a remaining contact point on a bridge chip to a corresponding contact pad on the module substrate, and wherein the plurality of solder bumps has a lower thermal melting temperature than the first means for interconnecting.

12. The multiple integrated circuit module of claim 11, wherein each of the plurality of integrated circuits is attached to a corresponding bridge chip to form a composite structure which can be handled and tested as a unit.

13. The multiple integrated circuit module of claim 13, wherein each of the plurality of integrated circuits is thermally coupled to the module substrate, the module substrate acting as a heat sink for each integrated circuit.

14. The multiple integrated circuit module of claim 11 wherein the plurality of bridge chips has at least one level of interconnect to interconnect the plurality of contact points on each bridge chip.

15. The multiple integrated circuit module of claim 11 wherein the module substrate has at least one level of interconnect to interconnect the plurality of contact points on the module substrate.

* * * * *

UNITED STATES PATENT AND TRADEMARK OFFICE
CERTIFICATE OF CORRECTION

PATENT NO. : 5,198,963
DATED : March 30, 1993
INVENTOR(S) : Gupta et al.

It is certified that error appears in the above-indentified patent and that said Letters Patent is hereby corrected as shown below:

Claim 13, Column 8, line 20, change "13" to --12--.

Signed and Sealed this

Eighteenth Day of October, 1994

Attest:

BRUCE LEHMAN

Attesting Officer

Commissioner of Patents and Trademarks